(12) United States Patent
Brevemark (10) Patent No.: US 10,933,436 B2
(45) Date of Patent: Mar. 2, 2021

(54) METHOD AND APPARATUS FOR CONTROLLING JET DISPENSING BY DISPLACEMENT MEASUREMENT

(71) Applicant: Mycronic AB, Taby (SE)

(72) Inventor: Daniel Brevemark, Taby (SE)

(73) Assignee: Mycronic AB, Taby (SE)

( * ) Notice: Subject to any disclaimer, the term of this patent is extended or adjusted under 35 U.S.C. 154(b) by 51 days.

(21) Appl. No.: 16/304,360

(22) PCT Filed: May 24, 2017

(86) PCT No.: PCT/EP2017/062662
§ 371 (c)(1),
(2) Date: Nov. 26, 2018

(87) PCT Pub. No.: WO2017/202985
PCT Pub. Date: Nov. 30, 2017

(65) Prior Publication Data
US 2019/0168251 A1 Jun. 6, 2019

(30) Foreign Application Priority Data
May 26, 2016 (SE) .................................... 1630120-2

(51) Int. Cl.
*B05B 12/08* (2006.01)
*B05B 1/08* (2006.01)
(Continued)

(52) U.S. Cl.
CPC ............ *B05C 5/0225* (2013.01); *B05B 1/083* (2013.01); *B05B 12/082* (2013.01);
(Continued)

(58) Field of Classification Search
CPC ....... B05B 12/08; B05B 12/082; B05B 1/083; B05C 11/1034; B05C 5/0225; H05K 3/125
See application file for complete search history.

(56) References Cited

U.S. PATENT DOCUMENTS

2002/0025260 A1* 2/2002 Maruyama ............ F04B 19/006
417/322
2004/0084549 A1 5/2004 Maruyama et al.
(Continued)

FOREIGN PATENT DOCUMENTS

WO WO-2014139568 A1 * 9/2014 ........... B23K 3/0623

OTHER PUBLICATIONS

International Search Report for International Application No. PCT/EP2017/062662 dated Aug. 8, 2017.
(Continued)

*Primary Examiner* — Alexander M Weddle
(74) *Attorney, Agent, or Firm* — Harness, Dickey & Pierce, P.L.C.

(57) ABSTRACT

A method for jetting a viscous medium onto a substrate is disclosed. The method includes providing viscous medium to a jetting chamber of an ejector, operating an impacting device to impact a volume of the viscous medium in the chamber such that viscous medium is jetted through a nozzle, connected to the chamber, towards the substrate, and monitoring a displacement of the impacting device during impact. An ejector and a system comprising such an ejector and a control unit is also disclosed. The monitoring of the displacement allows for the operation of the impacting device to be controlled accordingly, thereby providing for an improved control of the jetting process.

19 Claims, 5 Drawing Sheets

(51) Int. Cl.
*B05C 11/10* (2006.01)
*B05C 5/02* (2006.01)
*H05K 3/12* (2006.01)

(52) U.S. Cl.
CPC .......... *B05C 11/1034* (2013.01); *H05K 3/125* (2013.01); *B05B 12/08* (2013.01)

(56) References Cited

U.S. PATENT DOCUMENTS

| | | | |
|---|---|---|---|
| 2005/0167519 A1* | 8/2005 | Holm | B23K 1/0016 239/4 |
| 2007/0069041 A1 | 3/2007 | Quinones et al. | |
| 2014/0263688 A1* | 9/2014 | Doyle | B05C 5/0225 239/1 |
| 2016/0136661 A1 | 5/2016 | Hong et al. | |

OTHER PUBLICATIONS

European Communication dated Feb. 21, 2020 for corresponding European Application No. 17727544.3.

* cited by examiner

METHOD AND APPARATUS FOR CONTROLLING JET DISPENSING BY DISPLACEMENT MEASUREMENT

CROSS-REFERENCE TO RELATED APPLICATIONS

This is a national phase under 35 U.S.C. § 120 to, PCT International Application No. PCT/EP2017/062662, which has an international filing date of May 24, 2017, which claims priority to Swedish Patent Application No. 1630120-2, filed May 26, 2016 the entire contents of each of which are hereby incorporated by reference.

TECHNICAL FIELD

The invention disclosed herein relates to jetting of viscous medium onto a substrate. In particular, in relates to a method as well as an ejector and a system wherein a displacement of an impacting device of the ejector is monitored.

BACKGROUND

Ejectors and methods are known in the art for jetting droplets of viscous medium or fluid, e.g. solder paste, flux or adhesive, onto a substrate such as a printed wiring board (PWB), thus forming deposits that e.g. may be used for connecting electric components to the substrate. Such an ejector generally comprises a chamber for accommodating a volume of the viscous medium prior to the jetting thereof, a jetting nozzle communicating with the nozzle space, and an impacting device for impacting and jetting the viscous medium from the chamber through the nozzle in the form of droplets. Further, a feeder may be utilised to feed the medium into the nozzle space. The amount, or volume, of the deposited viscous medium at different locations on the substrate may be varied by applying several droplets on top of each other, thus forming a larger deposit, or by varying the volume of the jetted droplet by e.g. feeding a larger or smaller volume of the viscous medium into the chamber.

High production accuracy and reliability are factors of interest for the manufacturing of e.g. printed circuit board (PCB) assemblies. In particular, the reliability, such as e.g. the accuracy and the repeatability of the jetting process is of interest due to its effects on the performance and the quality of the final product, such as e.g. the PCB assembly. Too small volumes of deposited medium or poorly shaped or positioned deposits may e.g. lead to dry joints or loosening components, whereas too large volumes of deposited medium may lead to short-circuiting caused by e.g. solder balls, or defective contacts due to contamination of adhesive or underfill.

To increase process reliability and performance, an improved control of the application of the deposited medium is desirable so as to reduce the risk for unintentional short-cuts, contamination and erroneous volumes.

SUMMARY

An object of the technology disclosed is to provide an improved and more reliable application of jetted droplets onto a substrate.

This and other object of the technology disclosed are achieved by means of a method, ejector and system having the features defined in the independent claims. Different implementations of the technology disclosed are defined in the dependent claims.

The impacting device of the technology disclosed comprises a "freely moving" piston, i.e. a piston which is not restricted in its movement by a valve, seat or stop, and which motion is controlled by voltage and/or current over time and that have a returning position, or end position, for its reciprocating movement which varies over time, i.e. a length of stroke that varies over time.

By monitoring voltage and current over time and comparing to the displacement sensor according to aspects of the technology disclosed, variations in the hardware and the viscous media itself such as rheology differences in jetting media etc leading to unwanted variations in the returning position and the length of the stroke, can be detected and compensated for in a closed loop manner by adjusting the voltage and/or current which is applied to control the impacting device and the reciprocating movement of the piston.

The ejector of the technology disclosed also have an open connection, or inlet, to the channel of the feeder in that there is no valve or seat that will close the connection at any time. Thus, the channel remains open all the time.

The jetting principle of the technology disclosed is based on shearing and impacting the media and displacing media both forwards and backwards. Only the forward flow is jetted out through the nozzle in contrast to other so called jetting valves that close the channel with the impacting device and a seat in a positive displacement manner.

Other important differences between the ejector of the technology disclosed and other ejectors, e.g. ejectors having a seat or stop to create a closed system, is that the piston of the ejector of the technology disclosed is driven by applied voltage and/or current that over time control the whole reciprocating movement of the piston including both the forward and backwards movement which displaces the viscous medium in the chamber both forwards and backward.

By monitoring voltage and current over time and comparing to the displacement sensor according to aspects of the technology disclosed, rheology differences in jetting media etc can be detected and compensated for.

Each media in combination with nozzle diameter and shape have a process window were jetting quality and performance is best. Quality consists of several aspects, cohesive drop, stable drop formulation, high accuracy on hitting the intended target, volume stability and diameter stability etc. This process window is controlled by voltage and current over time and may compensate for variations in the hardware and the viscous media itself.

Hence, according to a first aspect of the technology disclosed, a method for jetting a viscous medium onto a substrate is provided. The method comprises the steps of providing viscous medium to a jetting chamber of the ejector, operating an impacting device to impact a volume of the viscous medium in the chamber such that viscous medium is jetted through a nozzle, connected to the chamber, towards the substrate, and monitoring a displacement of the impacting device during the impact. The method may comprise the following actions:

providing (110) viscous medium to a jetting chamber (5) of an ejector (1), said jetting chamber comprising an open connection, or inlet, to the channel of the feeder (12) providing the viscous medium to the chamber;

operating (120) an impacting device (6, 7) configured to be in direct contact with the viscous medium and, in a freely reciprocating movement in the chamber, controlled by the voltage and/or current applied to the actuator acting on the impacting device, directly impact and displace a volume of the viscous medium in the chamber such that viscous medium is jetted through a nozzle (4), connected to the chamber, towards the substrate; and monitoring (130) a displacement of the impacting device in order to compensate for variations in the returning position caused by at least one of variations in the hardware and the viscous media itself. In certain aspects of the technology disclosed, the variations in the returning position is compensated for by the above method by at least one of the subsequent actions of adjusting the voltage and/or current applied to an actuator acting on the impacting device (in order to adjust the returning position and length of the stroke) and input data affecting a feeding rate of viscous medium to the jetting chamber.

According to a second aspect, an ejector for jetting a viscous medium onto a substrate is provided. The ejector comprises a jetting chamber adapted to accommodate the viscous medium, a nozzle connected to the chamber, an impacting device adapted to impact a volume of the viscous medium in the chamber such that viscous medium is jetted through the nozzle towards the substrate, and a sensor arranged to output a sensor parameter reflecting a displacement of the impacting device during the impact.

According to a third aspect, a system for jetting viscous medium onto a substrate is provided, comprising an ejector according to the second aspect and a control unit adapted to control the operation of the impacting device based on the sensor parameter.

According to certain aspects, the technology disclosed provides a method for jetting a viscous medium onto a substrate (23), the method comprising:

providing (110) viscous medium to a jetting chamber (5) of an ejector (1), said jetting chamber comprising an open connection, or inlet, to the channel of the feeder (12) providing the viscous medium to the chamber;

operating (120) an impacting device (6, 7) configured to be in direct contact with the viscous medium to directly impact and displace a volume of the viscous medium in the chamber such that viscous medium is jetted through a nozzle (4), connected to the chamber, towards the substrate; and monitoring (130) a displacement of the impacting device performing a reciprocating movement inside the jetting chamber.

According to certain aspects, the technology disclosed provides a method for jetting a viscous medium onto a substrate (23), the method comprising:

providing (110) viscous medium to a jetting chamber (5) of an ejector (1), said jetting chamber comprising an open connection, or inlet, to the feeding channel of the feeder (12) providing the viscous medium to the chamber;

operating (120) an impacting device (6, 7) configured to be in direct contact with the viscous medium to thereby directly impact and displace a volume of the viscous medium in the chamber such that viscous medium is jetted through a nozzle (4), connected to the chamber, towards the substrate; and monitoring (130) a displacement of the impacting device in the jetting chamber.

According to certain aspects of the technology disclosed, the above method step of monitoring comprises monitoring a position of the impacting device to determine the position (e.g. the end position, or returning position, of the stroke, or forward impact movement) of the impacting device.

According to certain aspects of the technology disclosed, the above method step of monitoring comprises monitoring a sequence of positions of the impacting device with respect to its assembly housing (10) in the time domain during at least one of the forward impact movement of the impacting device and the controlled retraction of the impacting device to the initial position.

According to certain aspects of the technology disclosed, the above method step of monitoring the displacement of the impacting device comprises the steps of:

determining a length of a stroke of the impacting device during the impact; and calculating a correction factor based on a comparison between the determined length of the stroke and a reference length value;

wherein the correction factor is used for adjusting subsequent operation of the impacting device.

According to certain aspects of the technology disclosed, the above method step of monitoring the displacement of the impacting device comprises:

determining a length of a stroke of the impacting device during the impact; and calculating a correction factor based on a comparison between the determined length of the stroke and a reference length value;

wherein the correction factor is used for statistical processing and correction.

According to certain aspects of the technology disclosed, the above method step of monitoring the displacement of the impacting device comprises:

determining at least one of the velocity and acceleration of the impacting device during the impact; and calculating a correction factor based on a comparison between the determined acceleration and a reference acceleration value;

wherein the correction factor is used for at least one of adjusting subsequent operation of the impacting device and statistical processing and correction.

According to certain aspects of the technology disclosed, the above method step of monitoring the displacement of the impacting device comprises:

determining at least one of the velocity and acceleration of the impacting device during the impact; and calculating a correction factor based on a comparison between the determined position (e.g. the end position, or returning position, of the stroke, or forward impact movement), velocity and/or acceleration and a reference position, velocity and/or acceleration value;

wherein the correction factor is used for adjusting subsequent operation of the impacting device for the ongoing jet printing job.

According to certain aspects of the technology disclosed, the above method step of monitoring the displacement of the impacting device comprises:

determining at least one of the position (e.g. the end position, or returning position, of the stroke, or forward impact movement), velocity and acceleration of the impacting device during the impact; and calculating a correction factor based on a comparison between the determined position, velocity and/or acceleration and a reference position, velocity and/or acceleration value;

wherein the correction factor is used for real-time adjustments of the subsequent operation of the impacting device for the next stroke.

According to certain aspects of the technology disclosed, a system is provided for jetting viscous medium onto a substrate, the system comprising:

an ejector (1) according to claim 9; and a control unit (32) adapted to control the operation of the impacting device based on the sensor parameter, wherein control unit is adapted to:

based on the sensor parameter, determine at least one of a velocity, acceleration position (e.g. the end position, or returning position, of the stroke, or forward impact movement) or length of a stroke of the impacting device at any given time during the impact;

calculate a correction factor based on a comparison between the determined velocity, acceleration, position (e.g. the end position, or returning position, of the stroke, or forward impact movement) and/or length of the stroke and a reference value; and use said correction factor for adjusting subsequent operation of the impacting device.

According to certain aspects of the technology disclosed, an ejector (1) is provide for jetting a viscous medium onto a substrate (23), the ejector comprising:

a jetting chamber (5) adapted to accommodate the viscous medium;

a nozzle (4) connected to the chamber;

an impacting device (6, 7) adapted to impact a volume of the viscous medium in the chamber such that viscous medium is jetted through the nozzle towards the substrate; and a sensor (15) arranged to output a sensor parameter reflecting a displacement of the impacting device during the impact.

According to certain aspects of the above ejector, the sensor is comprised inside the chamber (5) and is arranged for non-contact measurement of at least one of the position (e.g. the end position, or returning position, of the stroke, or forward impact movement), velocity and acceleration of the impacting device.

According to certain aspects of the technology disclosed, the ejector and the system is provided with a control unit adapted to:

based on the signal or sensor parameter received from a detector, determine, in the time domain, a movement curve for the different positions of the impacting device during the impact;

calculate at least one correction factor based on a comparison between the determined movement curve and a reference movement curve; and use said correction factor for adjusting subsequent operation of the impacting device in order to achieve an adjusted movement curve in the time domain for the impacting device.

The impact of the impacting device affects the pressure in the viscous medium to be jetted. The pressure in the chamber may e.g. determined by the strength of the direct impact on the viscous medium by the impacting device, the length of the stroke, and the rheological characteristics of the viscous medium (a higher viscosity may e.g. lead to a higher pressure, and vice versa). The pressure induced by the impacting device may also depend on the amount of viscous medium present in the chamber, mechanical tolerances of the parts forming the ejector, friction forces acting on the impacting device during its movement, etcetera. Thus, displacement of the impacting device may be used to indirectly gain knowledge about the pressure in the chamber and other parameters that affect the operation of a specific ejector and/or the viscous medium currently used.

The present invention is based on the realisation that the actual displacement of the impacting device can be used as input when controlling subsequent movement of the impacting device. By monitoring the displacement during the impact, the operation of the ejector can be adjusted in response to the monitored displacement (and the indirectly monitored pressure in the chamber) so as to compensate for individual variations between different ejectors and/or variations in the rheological characteristics of the medium to be jetted. The ejectors may e.g. vary in terms of mechanical tolerances, friction and supply rate to the chamber, whereas the viscous characteristics of the viscous medium may vary in terms of e.g. overall viscosity, shear thinning properties, and thixotropy. The monitored displacement during the stroke may therefore be used in a closed loop manner to regulate the subsequent operation in terms of e.g. velocity and strength of stroke of the impacting device during the jetting process so as to dynamically improve the quality and reliability of the jetting.

Alternatively, or additionally, the monitored displacement may be used to calibrate or adjust the jetting parameters, i.e., the parameters controlling the operation of the hardware required for the jetting, to viscous media having different fluid dynamic behaviour and/or to different types of viscous media. In an exemplifying calibration process, the displacement may be monitored during jetting of one or several samples of a certain type of viscous medium (in one or several ejectors). The monitored displacement may then be used determining a set of jetting parameters that can be used for subsequent jetting of that specific type of viscous medium.

Thus, it will be appreciated that present invention may be used not only for a more or less continuous or real time monitoring of the jetting process, but also for calibrating the jetting process to different types of viscous media or ejectors. The real time monitoring of the jetting may be performed as the ejector is used in production, whereas the calibration e.g. may be performed once for each type of viscous medium or ejector, at predetermined intervals for quality check, or upon initiation by the operator.

As the viscous medium is subject to considerably varying shear rates during the jetting process, different rheological regimes may apply during different stages of the jetting process. From one point of view, it is advantageous if the viscous medium is shear thinning at relatively low shear rates, such as e.g. below $100 \text{ s}^{-1}$, to facilitate pumping and feeding the viscous medium to the chamber. From another point of view, it is advantageous if the viscous medium is shear thickening at relatively high shear rates, such as e.g. above $10.000 \text{ s}^{-1}$, to promote the formation of jetted droplets of well-defined shape and/or volume and prevent deformation or spraying when leaving the nozzle outlet and/or upon impact on the substrate.

The shear thickening of the viscous medium may thus be determined or at least affected by the movement of the impacting device (and thus the varying shear rate). The rheological behaviour of the viscous medium may in particular depend on e.g. the strength of the impact, the acceleration and the length of the stroke of the impacting device. By varying one or several of these parameters of the movement, the rheological behaviour (such as e.g. shear thickening) may be varied accordingly. Increasing the speed and/or acceleration of the movement may e.g. result in an increased viscosity (or shear thickening) of the solder paste, whereas a reduced speed and/or acceleration may lead to a reduced viscosity. Thus, the present invention allows for a better control of the viscosity of the viscous medium. Since the viscosity of the viscous medium during the jetting through the nozzle may affect speed and shape of the jetted droplet, the tendency of the droplet to e.g. spray, deform or spread on its way to the substrate may be controlled.

The displacement or the acceleration of the impacting device may further be monitored in relation to an upper and/or lower limit, wherein an out-of-bounds displacement may indicate a failure mode of the ejector. A relatively large displacement or acceleration may e.g. indicate absence, or insufficient amount, of viscous medium in the chamber. This may e.g. be caused by air voids enclosed in the viscous medium, by a discontinuity in the supply of medium to the nozzle chamber, or a defective ejector. A relatively small displacement, or low acceleration, may on the other hand indicate a clogged or blocked nozzle. Both failure modes may, detected by movement characteristics being outside a predetermined range, may lead to missed shots and/or insufficient amounts of jetted viscous medium on the substrate. In prior art technology, a defective printing result (i.e. missing deposits or deposits of wrong or inadequate volume) may be detected after the deposition of viscous medium, e.g. in a downstream inspection step or during a final testing of the product. There is hence a risk that several substrates having a defective printing result are processed before the errors are detected and therefore have to be reworked or discarded. The present invention is thus advantageous in that it provides the possibility to monitor the jetting of droplets during the jetting process or jetting program such that interruptions or disturbances of the jetting process can be detected during the jetting process in real time or at least early. Thereby potential defects of the printing result may be detected prior to forwarding the substrates downstream the processing line, which may improve the production yield, reduce the rejection rate, and reduce the reworking of substrates.

The present invention is also advantageous in that it provides the possibility to save additional, downstream inspection steps such as e.g. manual inspection or Automatical Optical Inspection (AOI). Reducing the number of tools of the production line, and/or the number operators may advantageously reduce production costs.

Further, the present invention provides the possibility to correct printing errors by supplemental jetting of droplets of the viscous medium onto the substrate without performing a separate inspection.

In the context of the present application, it is to be noted that the term "viscous medium" should be understood as a medium comprising e.g., solder paste, solder flux, adhesive, conductive adhesive, or any other kind of medium or fluid used for fastening components on a substrate, conductive ink, resistive paste, or the like. For at least some solder paste applications, the solder paste may include between about 40% and about 60% by volume of solder balls. The remaining volume may be solder flux. The solder balls are typically about 20 microns in diameter, or between about 10 and about 30 microns, inclusive, in diameter.

The term "jetted droplet", or "shot" should be understood as the volume of the viscous medium that is forced through the jetting nozzle and moving towards the substrate in response to an impact of the impacting device. It will however be appreciated that a plurality of droplets may be expelled from the nozzle in response to a single stroke of the impacting device.

As discussed herein, the term "deposit size" refers to the area on the workpiece, such as a substrate, that a deposit will cover. An increase in the droplet volume generally results in an increase in the deposit height as well as the deposit size.

A "workpiece" may be a board (e.g., a printed circuit board (PCB)), a flexible PCB or a printed wiring board (PWB), a substrate for ball grid arrays (BGA), a flexible substrate (e.g., paper), chip scale packages (CSP), quad flat packages (QFP), wafers, flip-chips, or the like.

In the context of the present application, it is noted that the term "jetting" should be interpreted as a non-contact deposition process that utilizes a fluid jet to form and shoot droplets of a viscous medium from a jetting nozzle onto a substrate, as compared to a contact dispensing process, such as "fluid wetting". In contrast to a dispenser and dispensing process where a needle in combination with, for contact dispensing, the gravitation force and adhesion force with respect to the surface is used to dispense viscous medium on a surface, an ejector or jetting head assembly for jetting or shooting viscous medium should be interpreted as an apparatus including an impacting device, such as an impacting device including, for example, a piezoelectric actuator and a plunger, for rapidly building up pressure in a fluid chamber by the rapid movement (e.g., rapid controlled mechanical movement) of an impacting device (e.g., the rapid movement of a plunger) over a period of time that is more than about 1 microseconds, but less than about 50 microseconds, thereby providing a deformation of the fluid in the chamber that forces droplets of viscous medium through a jetting nozzle. In one implementation, an ejection control unit applies a drive voltage intermittently to a piezoelectric actuator, thereby causing an intermittent extension thereof, and a reciprocating movement of a plunger with respect to the assembly housing of the ejector or jetting assembly head.

"Jetting" of viscous medium could refer to a process for ejecting or shooting droplets of viscous medium where the jetting of droplets of the viscous medium onto a surface may be performed while the at least one jetting nozzle is in motion without stopping at each location on the workpiece or substrate where viscous medium is to be deposited.

Typically, an ejector is software controlled. The software needs instructions for how to apply the viscous medium to a specific substrate or according to a given (or alternatively, desired or predetermined) jetting schedule or jetting process. These instructions are called a "jetting program". Thus, the jetting program supports the process of jetting droplets of viscous medium onto the substrate, which process also may be referred to as "jetting process" or "printing process". The jetting program may be generated by a pre-processing step performed off-line, prior to the jetting process.

According to some embodiments, the step of monitoring the displacement of the impacting device may comprise one or several of:
 determining a length of a stroke of the impacting device;
 determining an acceleration of the impacting device;
 determining a velocity of the impacting device; and
 determining a position of the impacting device at different times.

The determined parameters may be compared with a compared with a predetermined or stored reference value that may be provided in e.g. a look-up table. The result of the comparison may be used for adjusting at least one operation parameter determining the operation of the impacting device so as to adjust the length of the stroke, the acceleration or velocity of the impacting device, or the position of the impacting device at different times during the stroke. Examples of operation parameters include e.g. a voltage applied to an actuator, such as e.g. a piezoelectric actuator, acting on the impacting device, or the feeding rate of viscous medium supplied to the chamber. In case the monitored displacement of the impacting device indicates that the pressure in the chamber is below a reference value, the force applied by the actuator may e.g. be increased and/or the amount of the viscous medium that is supplied to the chamber be increased, and vice versa. The adjustment of the subsequent operation of the impacting device may e.g. be realised by the calculation of a correction factor for adjusting the operation parameters of the impacting device.

According to an embodiment, the sensor may be an optical sensor, a capacitive sensor, a magnetic sensor, a linear variable differential transformer (LVDT) sensor, voice coil or piezoelectric sensor. These sensors may also be referred to as non-contact sensors and may be configured for direct measurement of the displacement of movement of the impacting device. Examples of optical sensors include e.g. fibre optic fotonic sensors that are relatively small, accurate and have a relatively high bandwidth for capturing large data amounts at the relatively high frequencies of e.g. 100 to 500 Hz at which the impacting device may be operated. Further, fibre optic sensors may be relatively easy to install in the ejector as they may require less space than other sensors.

According to an embodiment, the sensor may be configured for contact measurement of the displacement. Such a sensor may e.g. be a strain sensor that may be attached to the impacting device or another structure moving with the impacting device.

The monitoring of the displacement of the impacting device may in additional, or alternative embodiments be performed by analysing a response from the actuator of the impacting device. The actuator may e.g. be a piezoelectric actuator, which may be adapted to generate an electric response that is indicative of the movement of the impacting device and/or a mechanical load exerted on the impacting device. Thus, by monitoring an electric response from the actuator the jetting process may be evaluated in terms of e.g. pressure in the jetting chamber and movement of the impacting device expelling viscous medium through the nozzle. This information may then be used as input for controlling, calibrating or adjusting the jetting process without any additional sensors.

The technology disclosed may be embodied as computer readable instructions for controlling a programmable computer in such manner that it causes an ejector or a system to perform the method outlined above. Such instructions may be distributed in the form of a computer-program product comprising a non-volatile computer-readable medium storing the instructions.

It will be appreciated that any of the features in the embodiments described above for the method according to the first aspect of the present invention may be combined with the ejector and the system according to the other aspects of the present invention.

Further objectives of, features of, and advantages with the present invention will become apparent when studying the following detailed disclosure, the drawings and the appended claims. Those skilled in the art will realise that different features of the present invention can be combined to created embodiment other than those described in the following.

BRIEF DESCRIPTION OF THE DRAWINGS

The above, as well as additional object, feature and advantages of the present invention, will be better understood through the following illustrative and non-limiting detailed description of embodiments of the present invention. Reference will be made to the appended drawings, on which.

All the figures are schematic, not necessarily to scale, and generally only show parts which are necessary in order to elucidate the invention, wherein other parts may be omitted or merely suggested.

DETAILED DESCRIPTION

Figure 1:
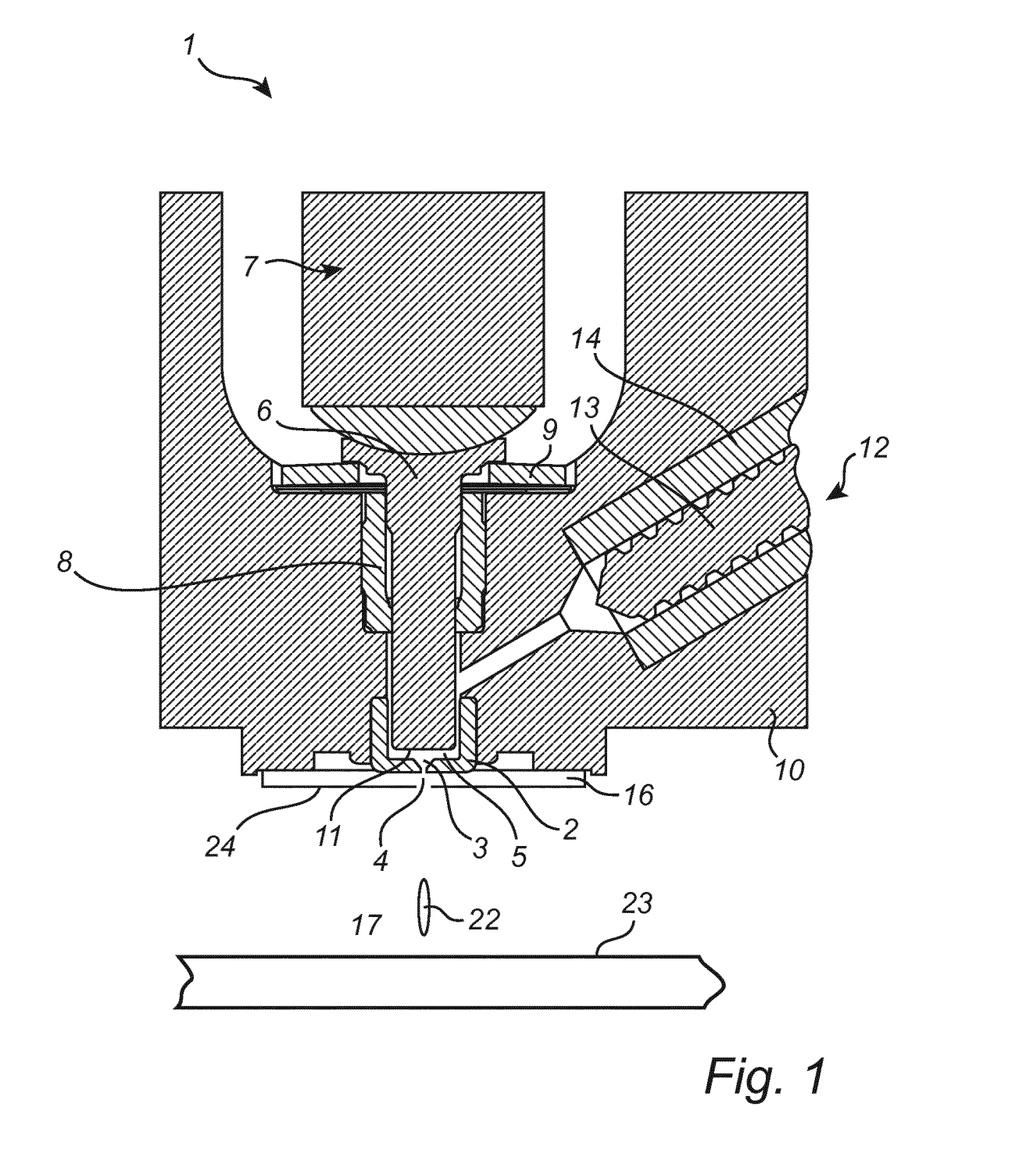
FIG. 1 is a schematic cross section of an ejector according to an embodiment of the present invention, comprising an impacting device, a nozzle and a chamber.

With reference to FIG. 1, there is shown a schematic view of an ejector according to an implementation of the technology described.

The ejector 1 comprises an assembly housing 10 and an impacting device, which in this implementation may include a piezoelectric actuator 7 and a plunger or piston 6 operatively connected to the piezoelectric actuator 7. The plunger 6 may be axially moveable while slideably extending through a bore hole in a bushing 8. Cup springs 9 may be provided to resiliently balance 30 the plunger 6 against the assembly housing 10, and for providing a preload for the piezoelectric actuator 7. A control unit 32 may apply a drive voltage intermittently to the piezoelectric actuator 7, thereby causing an intermittent extension thereof, and hence a reciprocating movement of the plunger 6 with respect to the assembly housing 10, in accordance with solder pattern printing data. The ejector 1 may include a sensor 15 that is configured to output a sensor signal S indicative of a directly or indirectly measured displacement of the impacting device to the control unit 32, wherein it may be processed to generate a new set of operation parameters for operating the ejector 1, wherein the operation parameters may be output from the control unit 32 in the form of a control signal O and transmitted to the ejector 1.

Furthermore, the ejector 1 may comprise jetting nozzle 2, which may be operatively directed against a substrate 23 onto which droplets 22 of viscous medium are to be jetted. The nozzle 2 may according to the present embodiment comprise a nozzle space 3 and a nozzle outlet 4 through which the droplets 22 are jetted towards the substrate 23. The nozzle outlet 4 may be located at one end, such as a lower portion, of the nozzle 2.

A chamber 5 may be defined between an end surface 11 of the plunger 6 and the nozzle 2. Axial movement of the plunger 6 towards the nozzle 2 may cause a rapid decrease in the volume of the chamber 5. Such an impact by the plunger 6 may thus cause a rapid pressurisation and jetting of viscous medium through the nozzle outlet 4.

In other implementations of the technology disclosed using a different type of ejector, the plunger comprising a piston may be replaced by another type of freely moving impacting device which is still controlled by voltage and current over time like the piston and where the impacting device, like for the piston, also have a returning position for its reciprocating movement which varies over time.

The ejector of the technology disclosed must further have an open connection, or inlet, to the channel of the feeder in that there is no valve or seat that will close the connection at any time. The channel remains open all the time even the smallest restriction, jetting principle is based on shearing an impacting the media and displacing media both forwards and backwards. Only the forward flow is jetted out through the nozzle in contrast to other so called jetting valves that close the channel with a impacting device and a seat in a positive displacement manner.

All these impacting devices have in common that they are configured to provide for a non-contact jetting process to form and shoot droplets of a viscous medium from a jetting nozzle onto a substrate by quickly generating a pressure impulse by the reciprocating, or vibrating movement of the impacting device.

The impacting devices may move from a starting position towards an end position during a time period of about 1 to 50 microseconds in order to shoot individual droplets having a deposit volume between about 0.1 nanolitres and 30 nanolitres, such as e.g. 1 to 5 nanolitres, 5 to 15 nanolitres or 10 to 20 nanolitres. The speed of the impacting device for impacting the nozzle with a pressure impulse may be between about 5 m/s and about 50 m/s.

Viscous medium may be supplied to the nozzle space 3 from a supply container (not shown in FIG. 1), via the feeding channel of a feeder 12. The feeder 12 may comprise an electric motor (not shown) having a motor shaft 13 partly provided in a tubular bore that extends through the ejector housing 10 to an outlet port communicating with the chamber 5 via a channel. At least a portion of the rotatable motor shaft, or feed screw 13 may be surrounded by a tube 14 made of an elastomer or the like arranged coaxially therewith in the tubular bore, wherein the threads of the rotatable feed screw 13 may be in sliding contact with the innermost surface of the tube. Viscous medium captured between the threads of the feed screw 13 and the inner surface may then be forced towards the chamber 5 in accordance with the rotational movement of the feed screw 13.

Figure 2:
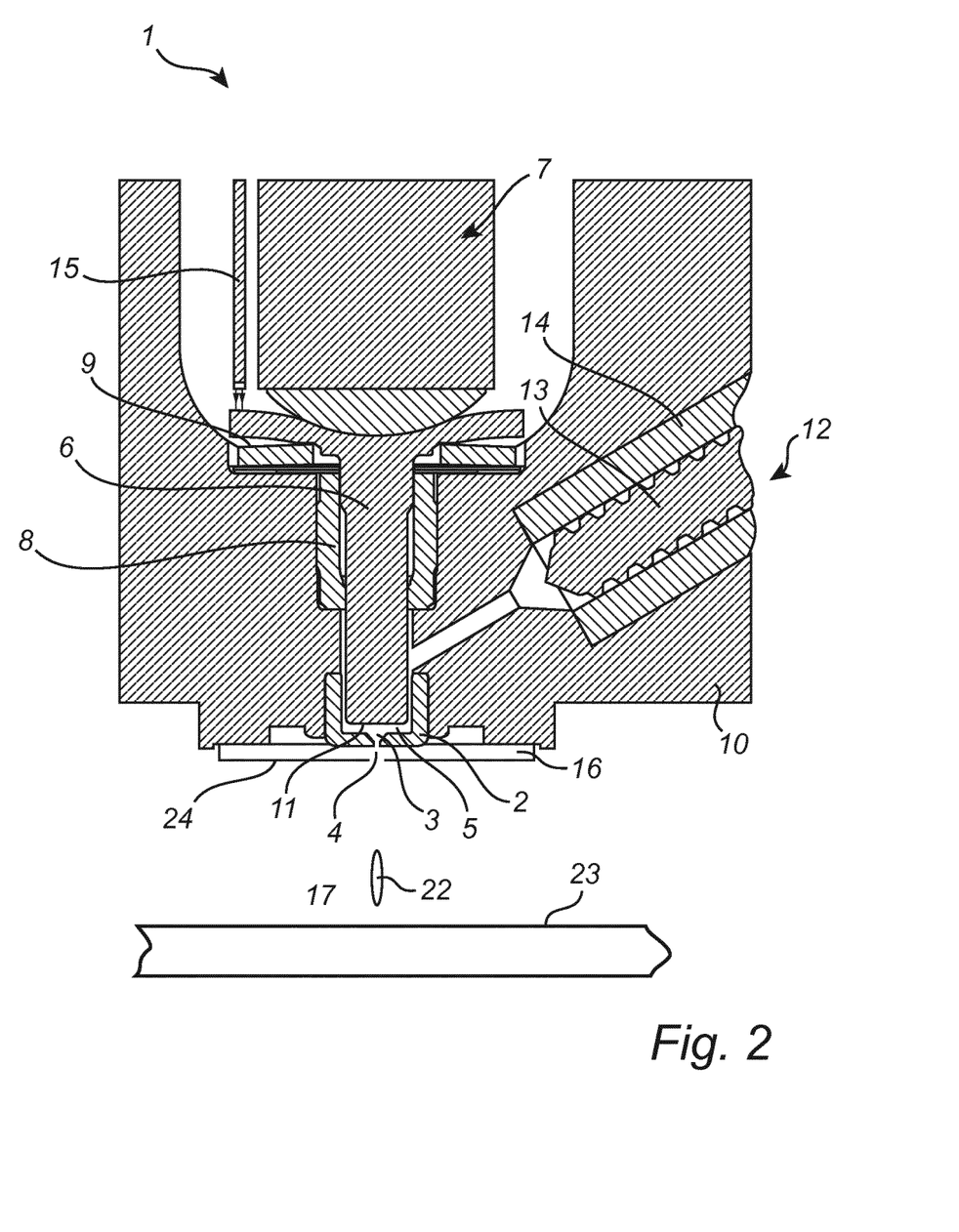
FIGS. 2 to 4 are a cross sections of ejectors according to some embodiments of the present invention.

FIG. 2 illustrates an ejector according to an embodiment of the invention, which may be similarly configured as the ejector described with reference to FIG. 1. In the present embodiment, a sensor 15 is arranged to output a signal carrying a sensor parameter reflecting the displacement of the impacting device during the jetting process. The impacting device of the present, exemplifying embodiment constitutes a piezoelectric actuator comprising a number of thin, piezoelectric elements stacked together to form an actuator part 7. One, upper, end of the actuator part 7 is rigidly connected to the assembly housing whereas the lower part rests on the plunger 6.

The upper part of the plunger 6, i.e., the portion of the plunger 6 on which the actuator acts 7, may have a protrusion or flange that can be viewed by the sensor 15. The sensor 15 may e.g. be a non-contact fibre optic displacement sensor configured to measure the displacement of the plunger 6 based on reflectance measurements on the protrusion.

Other configurations are however conceivable, utilising other principles for measuring displacement and/or measuring other parts of the ejector. A few examples will now be discussed.

Figure 3:
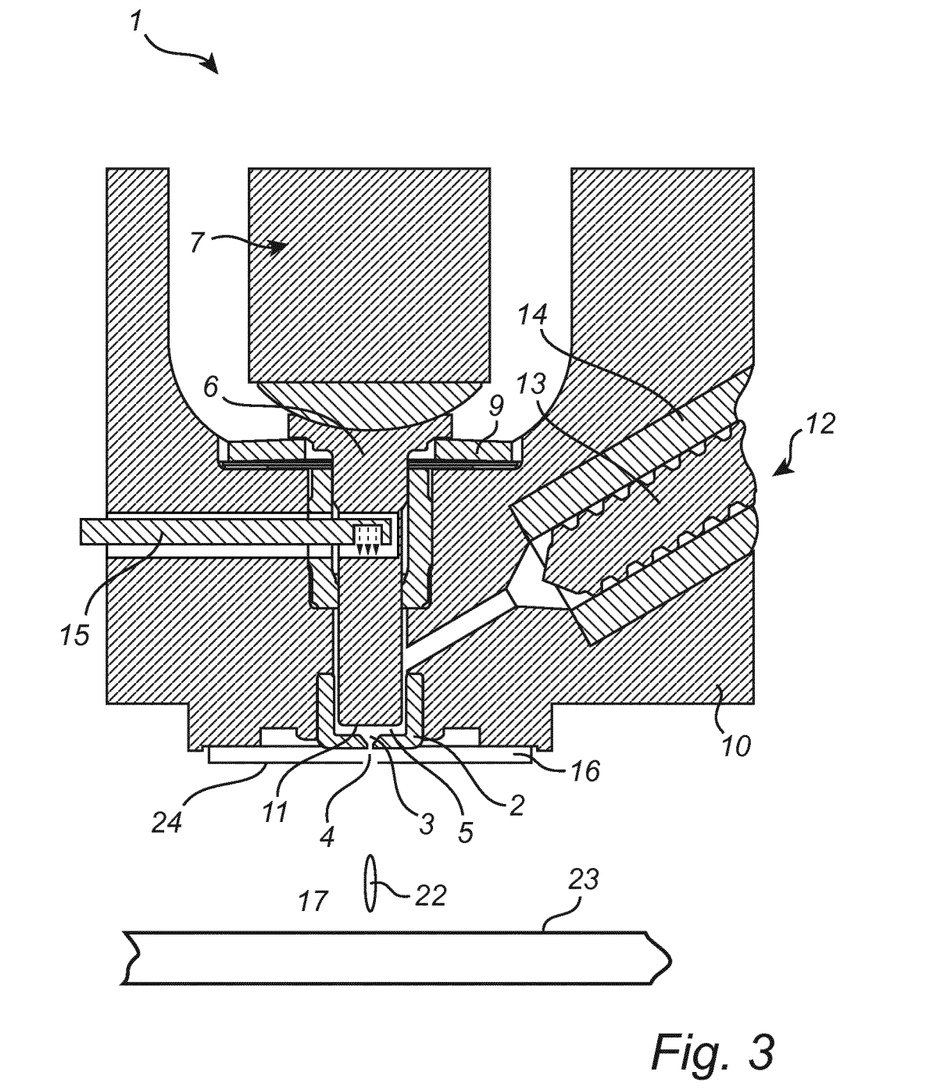

FIG. 3 shows an ejector that may be similarly configured as the ejectors described with reference with FIGS. 1 and 2. As indicated in FIG. 3, the sensor 15 may be adapted to measure the displacement of the impacting device through a recess or slit in the plunger 6. The sensor may e.g. be introduced through a channel in the housing 10 to reach a lateral side of the plunger 6, and further inserted in the recess or slit of the plunger 6 so as to allow the displacement to be measured. The measurement may be performed by a non-contact reflectance measurement in the slit, preferably on a surface having a normal aligned with the axis of movement of the plunger 6.

Figure 4:
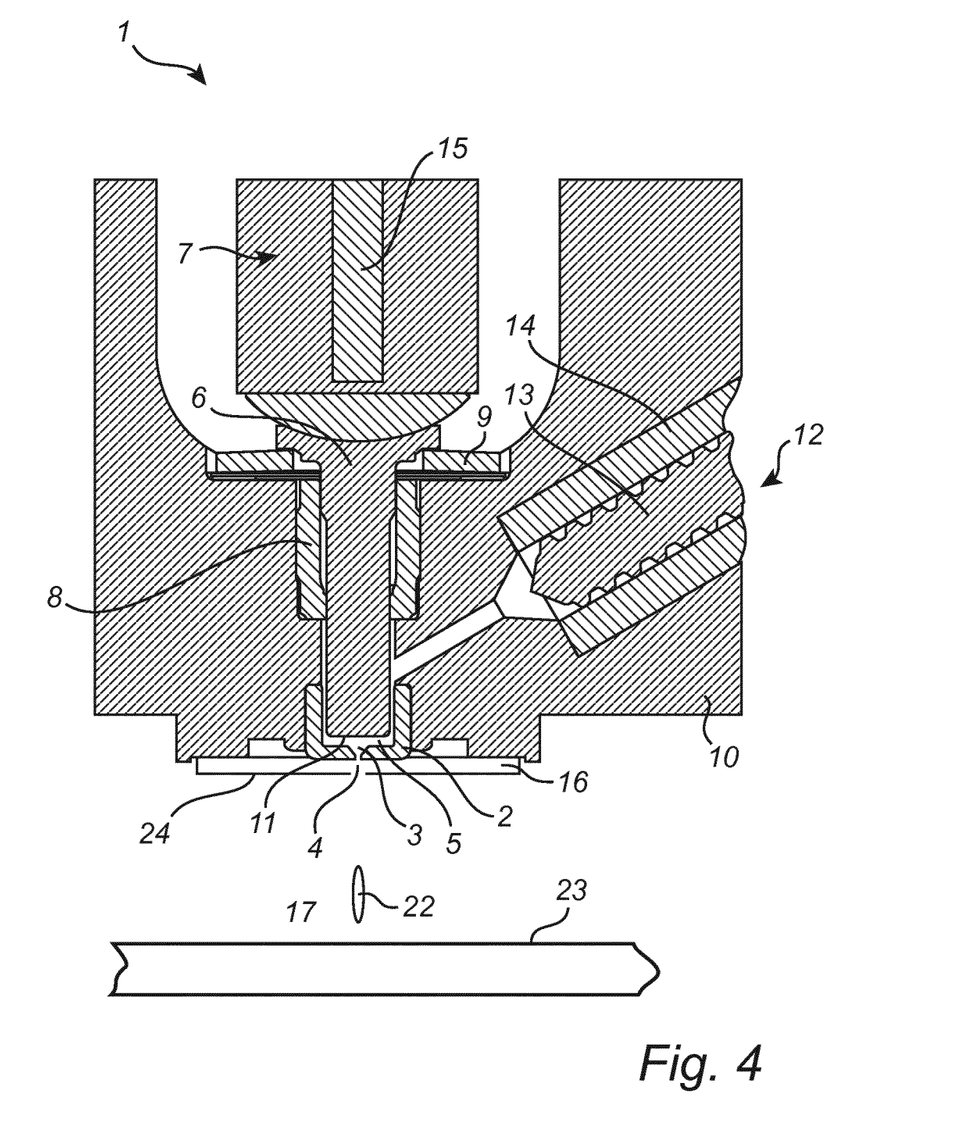

FIG. 4 shows an ejector that may be similar to the previously disclosed embodiments, wherein a contact sensor 15 may be used for determining a displacement of the impacting device. The sensor 15 may e.g. be a strain sensor that is adapted to measure a strain or deformation of the actuator 7 during the stroke. The actuator 7 may e.g. be a piezoelectric actuator that expands axially in response to an applied voltage and thereby causes a displacement of the plunger 6. By measuring the expansion (or deformation) of the actuator 7, the displacement of the plunger 6 may be calculated.

Figure 5:
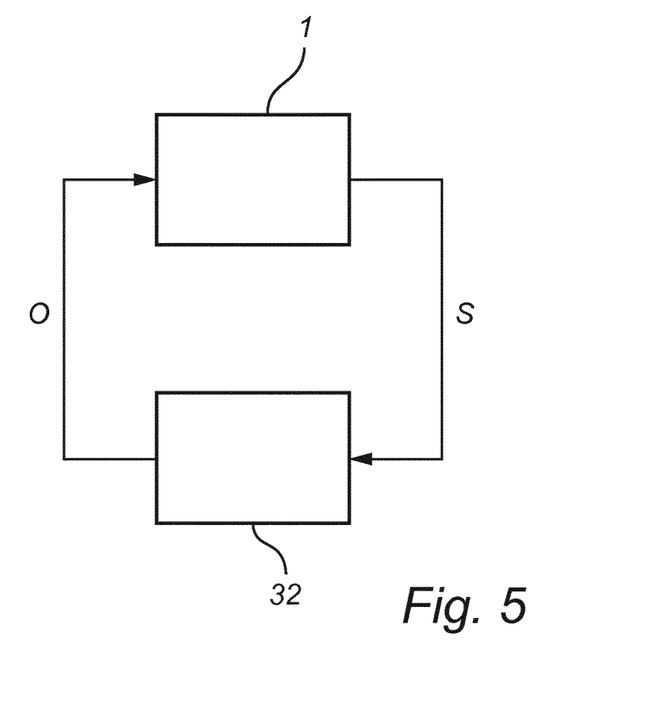
FIG. 5 is a schematic representation of a system according to an embodiment, comprising an ejector and a control unit.

FIG. 5 is a schematic representation of a system according to an embodiment of the present invention. The system may comprise an ejector 1 according to any of the above described embodiments, including the ejector 1 shown in the FIGS. 1-4, and a control unit 32. The ejector 1 comprises a sensor (shown in FIGS. 1-4, not shown in FIG. 5) that is configured to output a sensor signal S indicative of a directly or indirectly measured displacement of the impacting device. The sensor signal S may be transmitted to the control unit 32, wherein it may be processed and the measured displacement compared to a reference value or translated to an estimated pressure in the chamber. The reference value may e.g. be provided in the form of a list entry or a post in a look-up table. Based on the comparison between the measured displacement and the reference value, a correction factor may be calculated and a used for generating a new set of operation parameters for operating the ejector 1. The operation parameters may be output from the control unit 32 in the form of a control signal O and transmitted to the ejector 1. Thus, the monitored movement of the impacting device may be used in a closed-loop manner for adjusting the operation of the ejector.

Figure 6:
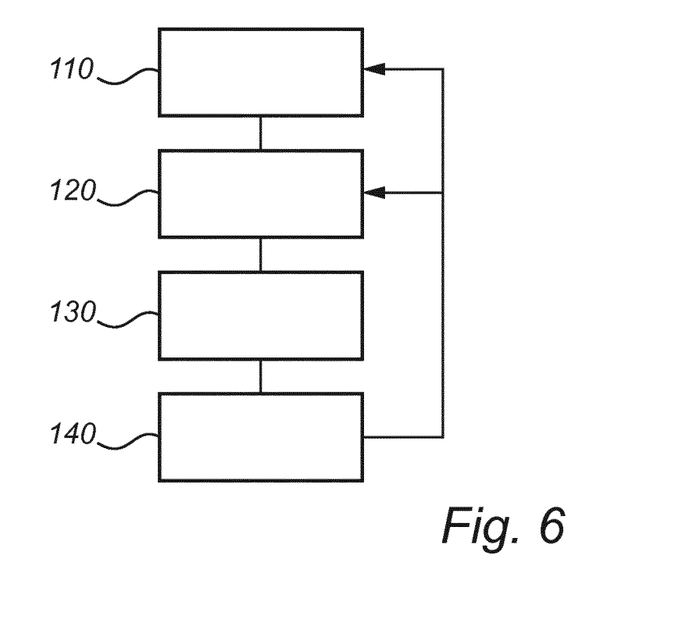
FIG. 6 is a flow chart illustrating a method for jetting a viscous medium according to an embodiment.

FIG. 6 is a flow chart illustrating a method for jetting viscous medium according to an embodiment of the present invention. The method may be performed in an ejector or a system that may be similarly configured as any of the previously described ejectors and systems. According to the present embodiment, the method may comprise a step of providing 110 viscous medium to the jetting chamber of the ejector. This may e.g. be achieved by means of a feeder that includes an electric motor, a rotatable feed screw and an elastomeric tube that is in sliding contact with feed screw. The feed rate of the viscous medium may e.g. be controlled by varying the operating speed of the step motor.

Further, the method may comprise a step of operating 120 the impacting device such that it impacts the viscous medium in the jetting chamber and expels at least a part of the viscous medium through the nozzle. The impacting device may e.g. be operated according to a set of operating parameters supplied from the control unit and controlling e.g. the strength and speed of the impact.

The method also comprises a step of monitoring 130 a signal or sensor parameter from the sensor, reflecting a displacement of the impacting device as viscous medium is jetted. The monitored signal or sensor parameter may then be evaluated 140 to generate correction factors that may be fed back to the step of providing 110 the viscous medium to the chamber and/or the step of operating 120 the impacting device. These feedback loops are indicated by arrows in the figure. The correction factors, which may be based on a determined difference between the sensed displacement and a reference value, may e.g. be used for adjust the feed rate and the movement, such as velocity and acceleration, of the impacting device in subsequent steps. Thus, the jetting process may be controlled in such manner that the quality and reliability is increased.

As outlined above, the method may be embodied as computer-executable instructions distributed and used in the form of a computer-program product including a computer-readable medium storing such instructions. By way of example, computer-readable media may comprise computer storage media and communication media. As is well known to a person skilled in the art, computer storage media includes both volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices. Further, it is known to the skilled person that communication media typically embodies computer readable instructions, data structures, program modules or other data in a modulated data signal such as a carrier wave or other transport mechanism and includes any information delivery media.

The invention claimed is:

1. A method for jetting a viscous medium onto a substrate, the method comprising:
    providing viscous medium to a jetting chamber of an ejector, the jetting chamber including an inlet to a channel of a feeder providing the viscous medium to the jetting chamber;
    operating a freely-moving impacting device configured to be in direct contact with the viscous medium and not restricted in movement by a valve, seat, or stop such that the freely-moving impacting device freely reciprocates and has a returning position that varies over time, the operating causing the freely-moving impacting device to freely reciprocate to directly impact and displace a volume of the viscous medium in the jetting chamber such that viscous medium is jetted through a nozzle, connected to the jetting chamber, towards the substrate;
    monitoring a displacement of the freely-moving impacting device during the impact;
    determining a variation of the returning position from a reference returning position based on the monitoring; and
    adjusting the returning position of the freely-moving impacting device to compensate for the variation of the returning position, in response to determining the variation.

2. The method according to claim 1, wherein freely reciprocating movement of the freely-moving impacting device includes a forward impact movement of the freely-moving impacting device, and the monitoring includes monitoring a position of the freely-moving impacting device to thereby determine the returning position.

3. The method according to claim 1, wherein the monitoring includes monitoring a sequence of positions of the freely-moving impacting device with respect to an assembly housing of the freely-moving impacting device in a time domain during at least one of a forward impact movement of the freely-moving impacting device and a controlled retraction of the freely-moving impacting device to an initial position.

4. The method according to claim 1, wherein the monitored displacement is used as input data affecting subsequent operation of the freely-moving impacting device.

5. The method according to claim 1, wherein the monitoring includes
    determining a position, velocity, acceleration, and/or length of a stroke of the freely-moving impacting device during the impact; and
    calculating a correction factor based on a comparison between the determined position, velocity, acceleration, and/or length of the stroke and at least one reference value;
    wherein the correction factor is used for adjusting subsequent operation of the freely-moving impacting device.

6. The method according to claim 1, wherein the monitoring includes
    determining, in a time domain, a movement curve for different positions of the freely-moving impacting device during the impact; and
    calculating a correction factor based on a comparison between the determined movement curve and a reference length value;
    wherein the correction factor is used for adjusting subsequent operation of the freely-moving impacting device.

7. The method according to claim 1, wherein the monitoring includes
    determining a position, velocity, and/or acceleration of the freely-moving impacting device during the impact; and
    calculating a correction factor based on a comparison between the determined position, velocity, and/or acceleration and a reference value;
    wherein the correction factor is used for at least one of adjusting subsequent operation of the freely-moving impacting device and statistical processing and correction.

8. The method according to claim 1, wherein the monitored displacement of the freely-moving impacting device is used as input data affecting a feeding rate of viscous medium to the jetting chamber.

9. The method according to claim 1, further comprising:
    calculating at least one presence value based on a comparison between the displacement of the freely-moving impacting device and a reference displacement value to identify a presence of viscous medium in the jetting chamber.

10. The method according to claim 1, wherein the monitoring includes
    determining a position of the freely-moving impacting device at different times during at least one of a forward impact movement of the freely-moving impacting device and a controlled retraction of the freely-moving impacting device to an initial position.

11. The method according to claim 1, further comprising:
    identifying a failure mode based on a comparison between the displacement of the freely-moving impacting device and at least one reference parameter value.

12. An ejector for jetting a viscous medium onto a substrate, the ejector comprising:
    a jetting chamber configured to accommodate the viscous medium, the jetting chamber including an inlet to a channel of a feeder configured to provide the viscous medium to the jetting chamber;
    a nozzle connected to the jetting chamber;
    a freely-moving impacting device configured to impact a volume of the viscous medium in the jetting chamber such that viscous medium is jetted through the nozzle towards the substrate, the freely-moving impacting device not restricted in movement by a valve, seat, or stop such that the freely-moving impacting device freely reciprocates and has a returning position that varies over time, the freely-moving impacting device configured to freely reciprocate to impact the volume of the viscous medium in the jetting chamber; and a sensor configured to output a signal or sensor parameter reflecting a displacement of the freely-moving impacting device during the impact, wherein the freely-moving impacting device is configured to adjust the returning position based on a control signal to compensate for a variation of the returning position from a reference returning position, wherein the control signal is received in response to a determination of the variation based on the signal or sensor parameter.

13. The ejector according to claim 12, wherein the sensor is comprised inside the jetting chamber and is configured to perform non-contact measurement of position, velocity, and/or acceleration of the freely-moving impacting device.

14. The ejector according to claim 12, wherein the sensor is an optical sensor, a capacitive sensor, a magnetic sensor, a linear variable differential transformer sensor, a voice coil, or a piezoelectric sensor.

15. The ejector according to claim 12, wherein the sensor is a strain sensor.

16. A system for jetting viscous medium onto a substrate, the system comprising:
 the ejector according to claim 12; and
 a control unit configured to control operation of the freely-moving impacting device based on the signal or sensor parameter.

17. The system according to claim 16, wherein the control unit is configured to:
 based on the signal or sensor parameter, determine a velocity, acceleration, position, and/or length of a stroke of the freely-moving impacting device during the impact;
 calculate a correction factor based on a comparison between the determined velocity, acceleration, position and/or length of the stroke and at least one reference value; and
 use the correction factor to adjust subsequent operation of the freely-moving impacting device.

18. The system according to claim 16, wherein the control unit is configured to:
 based on the signal or sensor parameter, determine an acceleration of the freely-moving impacting device during the impact;
 calculate a correction factor based on a comparison between the determined acceleration and a reference acceleration value; and
 use the correction factor for adjusting subsequent operation of the freely-moving impacting device.

19. The system according to claim 16, wherein the control unit is configured to:
 based on the signal or sensor parameter, determine, in a time domain, a movement curve for different positions of the freely-moving impacting device during the impact;
 calculate at least one correction factor based on a comparison between the determined movement curve and a reference movement curve; and
 use the correction factor for adjusting subsequent operation of the freely-moving impacting device in order to achieve an adjusted movement curve in the time domain for the freely-moving impacting device.

* * * * *